United States Patent
Bliss et al.

(10) Patent No.: US 7,276,121 B1
(45) Date of Patent: *Oct. 2, 2007

(54) FORMING IMPROVED METAL NITRIDES

(75) Inventors: David F. Bliss, Arlington, MA (US); Vladimir L. Tassev, Wakefield, MA (US); Michael J. Suscavage, Shirley, MA (US); John S. Bailey, Temple, NH (US)

(73) Assignee: United States of America as represented by the Secretary of the Air Force, Washington, DC (US)

( * ) Notice: Subject to any disclaimer, the term of this patent is extended or adjusted under 35 U.S.C. 154(b) by 6 days.

This patent is subject to a terminal disclaimer.

(21) Appl. No.: 10/985,063

(22) Filed: Nov. 10, 2004

Related U.S. Application Data

(62) Division of application No. 10/083,613, filed on Feb. 26, 2002, now Pat. No. 6,969,426.

(51) Int. Cl.
*C30B 35/00* (2006.01)

(52) U.S. Cl. .............. 118/715; 719/723 VE; 719/726; 117/200; 117/106; 117/108

(58) Field of Classification Search ............ 118/715, 118/719, 723 VE, 726; 117/200, 106, 108
See application file for complete search history.

(56) References Cited

U.S. PATENT DOCUMENTS

| 4,144,116 A * | 3/1979 | Jacob et al. .................. 117/91 |
| 5,916,365 A * | 6/1999 | Sherman ...................... 117/92 |
| 6,177,292 B1 * | 1/2001 | Hong et al. .................. 438/46 |
| 6,676,752 B1 * | 1/2004 | Suscavage et al. ......... 117/104 |
| 2001/0000733 A1 * | 5/2001 | Tomioka ........................ 427/8 |

* cited by examiner

*Primary Examiner*—Yogendra N. Gupta
*Assistant Examiner*—Matthew J. Song
(74) *Attorney, Agent, or Firm*—AFMCLO/JAZ

(57) ABSTRACT

Method and apparatus are provided for forming metal nitride (MN), wherein M is contacted with iodine vapor or hydrogen iodide (HI) vapor to form metal iodide (MI) and then contacting MI with ammonia to form the MN in a process of reduced or no toxicity. Such method is conducted in a reactor that is maintained at a pressure below one atmosphere for enhanced uniformity of gas flow and of MN product. The MN is then deposited on a substrate, on one or more seeds or it can self-nucleate on the walls of a growth chamber, to form high purity and uniform metal nitride material. The inventive MN material finds use in semiconductor materials, in nitride electronic devices, various color emitters, high power microwave sources and numerous other electronic applications.

5 Claims, 4 Drawing Sheets

FORMING IMPROVED METAL NITRIDES

RELATED APPLICATIONS

This application relates to U.S. Pat. No. 6,113,985 by Suscavage et al (2000), U.S. Pat. No. 6,406,540 B1 by Meckie Harris et al (2002), as well as U.S. Pat. No. 6,676,752 B1 by Suscavage et al. (2004), entitled "Forming Metal Nitrides", all of which relate to the formation of metal nitrides. Also, this Application is a Divisional of application Ser. No. 10/083,613, filed on 26 Feb. 2002, now U.S. Pat. No. 6,969,426, having the same title.

STATEMENT OF GOVERNMENT INTEREST

The invention described herein may be manufactured and used by or for the government for governmental purposes without the payment of any royalty thereon.

FIELD OF THE INVENTION

This invention relates to preparation of metal nitrides, particularly more uniform preparation thereof by methods of reduced toxicity.

BACKGROUND OF THE INVENTION

The above patent application avoids a prior art problem in forming metal nitrides, in that it avoids the use of hydrogen chloride gas, which has a toxic and corrosive nature, which gas is, however, typically used in prior art preparation of GaN.

However, the process of the above application is run at atmospheric pressure, where uniformity of gas flow, particularly of $NH_3$, can be a problem.

In the prior art there is U.S. Pat. No. 6,113,985 (2000), which relates to the preparation of metal nitrides but in needles rather then in crystals or in film form.

Accordingly there is need and market for an improvement in metal nitride formation that overcomes the above prior art shortcomings.

There has now been discovered a method to improve the gas flow uniformity of gas flow in metal nitride formation that results in a more uniform metal nitride product.

SUMMARY OF THE INVENTION

Broadly, the present invention provides a method for forming metal nitride (MN) which includes contacting a metal (M) with iodine ($I_2$) vapors or hydrogen iodide (HI), to form a metal iodide (MI) and then contacting the MI with ammonia ($NH_3$) to form MN at pressures below 1 atmosphere including between 0.99 to 0.1 atmosphere or below 760 Torr.

The invention further provides a reactor for forming a metal nitride (MN) comprising, a) a first container,
b) the container having an upstream inlet, followed by a first boat for iodine ($I_2$), a second boat for M spaced downstream from the first boat and an outlet located downstream from the second boat,
c) means to reduce the pressure in the container to below 760 Torr,
d) means for heating the two boats,
e) means for flowing iodine vapor from the first boat or for flowing hydrogen iodide (HI) from the inlet down- stream to the second boat to contact the M to form metal iodide (MI) vapor and for flowing the MI vapor out said outlet and
f) means to contact the outlet MI vapor with ammonia to form the MN.

Such MN is preferably the form of gallium nitride (GaN), aluminum nitride (AlN), indium nitride (InN) or quaternary or ternary combinations thereof.

The present invention relates to semiconductor materials and in particular it relates to forming more uniform metal nitrides including GaN.

Definitions:

By "ammonia" as used herein, is meant ammonia gas.

By "MN", as used herein, is meant metal nitride or metal nitrides.

By "heated metal", as used herein, is meant metal heated from 500 to 1000° C., including molten metal.

As will be seen herein, the invention provides a two-step process in which the metal iodide (MI) is formed in the first step, which MI is subsequently converted to MN in the second step, all at reduced pressure, which deposits in the forms noted herein. Such process is known as Iodine Vapor Phase Growth (IVPG). Also, the present invention is described in a Paper entitled "Iodine Vapor Phase Growth of GaN: Dependence of Epitaxial Growth Rate on Process Parameters" by Vladimir Tassev et al., published in The Journal of Crystal Growth, Vol. 235, in February 2002, which Paper is incorporated herein by reference.

BRIEF DESCRIPTION OF THE DRAWINGS

The invention will become more apparent from the following detailed specification and drawings in which.

DESCRIPTION OF THE PREFERRED EMBODIMENTS OF THE INVENTION

The invention provides a process and apparatus for producing M-nitride materials wherein M=gallium (GaN), aluminum (AlN), indium (InN), and ternary nitrides such as gallium aluminum nitride (GaAlN) and gallium arsenic nitride (GaAsN) as well as quaternary nitrides such as gallium aluminum indium nitride (GaAlInN) and gallium arsenic indium nitride (GaAsInN). The process provides for depositing layers on a substrate by epitaxial growth, seeded growth on small single crystals or self-nucleated freestanding single crystals. High purity polycrystalline material can also be formed for use in other processes.

The process can use a solid iodine source or gaseous hydrogen iodide. Typically, the mildly heated iodine source is moved as a vapor by a carrier gas to react with the M-metal, forming M-metal iodide such as gallium iodide. The carrier gas can be hydrogen or inert or combination thereof. Once the M-metal iodide is formed, the carrier gas moves the M-metal iodide out of the isolated reaction area to a section of the reaction chamber where the M-metal iodide can intermingle and react with ammonia. In this system, the iodine and the M-metal are isolated from the ammonia until the M-metal iodide is formed.

The deposition process and quality of the deposited metal nitride are adjusted and controlled by varying the temperature of the iodine source, the M-metal-iodine reaction, and the M-metal iodide ammonia reaction. Varying the temperature of the iodine source controls the amount of iodine available to react with M-metal. The temperature of the M-metal source controls the amount of M-metal iodide entrained in the gas stream. The temperature where the M-metal iodide intermingles with the ammonia as well as the flow rate thereof control the kinetics of forming the metal nitride, which in-turn, controls the quality of the deposited metal nitride be it in bulk or film form. Also reducing the pressure of the system, as indicated in FIG. 1, greatly enhances the uniformity of gas flow and of deposited product as discussed below.

Figure 1:
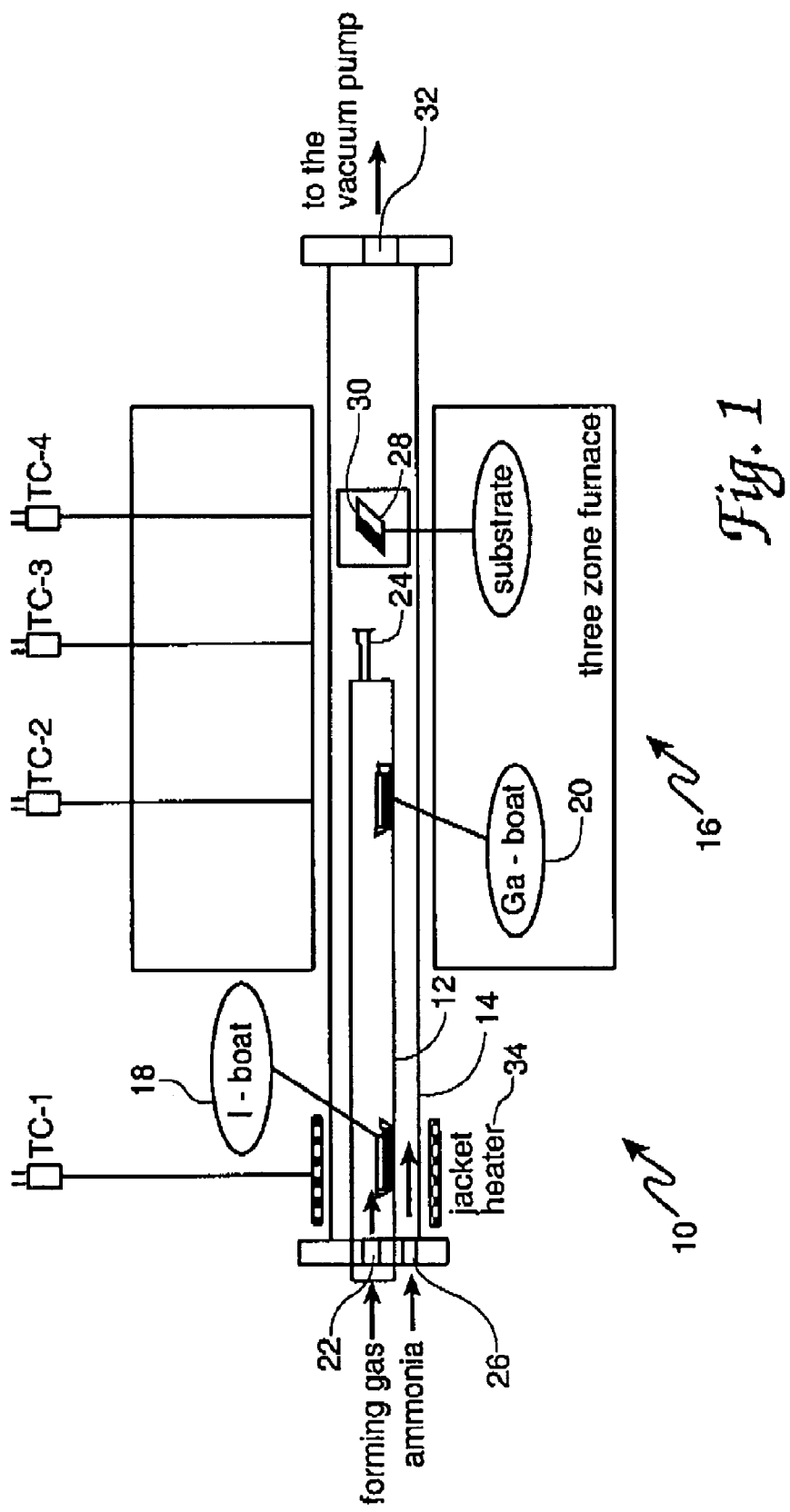
FIG. 1 is an elevation schematic view of an apparatus employed in the present inventive method.

Referring now to FIG. 1, the IVPG horizontal reactor 10 has quartz tube 12 mounted within a, larger quartz tube 14 which are placed within a three zone furnace 16, as shown.

Upstream in tube 12 is mounted iodine in an iodine boat 18, while the metal of choice is loaded in boat 20, downstream in such tube 12, per FIG. 1. Such inner tube 12 has a inlet 22 for forming gas, such as hydrogen and an outlet tube 24, which permits exit of metal iodide vapor, as shown in FIG. 1.

Also ammonia is fed into the outer tube 14 by inlet 26 and such tube 14 also contains a substrate holder 28, which supports substrate 30 thereon and at the downstream end of such tube 14 is an exit 32, which conveys exhaust vapors to a vacuum pump, which maintains the interior of tube 14 below atmospheric pressure, as indicated in FIG. 1.

A jacket heater 34 heats the iodine in the iodine boat 18 to a desired temperature, as measured by a thermocouple, TC-1, while a three zone furnace 16 heats, respectively, the metal in the metal boat 20 to a molten temperature, as controlled by TC-2, the metal iodide vapor exit zone at exit nozzle 24, as controlled by TC-3 and the substrate zone around substrate 30 is heated to a desired temperature, as controlled by TC-4, all as shown in FIG. 1.

In operation, the tube system is now purged by flowing forming gas through inlet 22 and ammonia through inlet 26, to remove residual atmospheric gases such as oxygen and water vapor or can be evacuated then purged as above. Then the tube system can be evacuated to below 760 Torr to a desired reduced pressure. Once the respective tubes are purged and evacuated, the furnace 16 is heated to the appropriate temperature to remove oxides and other contaminants from the metal of choice in boat 20. With the above gases continuing to flow through inlets 22 and 26, the heating jacket 34 is turned on to cause the iodine in boat 18 to vaporize and become entrained in the gas stream entering the gas inlet 22. The iodine travels downstream inside the fused quartz tube 12, to react with the molten metal in boat 20 to form metal iodide (MI). This so formed metal iodide then travels out the outlet 24 of such tube 12, towards the substrate 30, as indicated in FIG. 1. Once the metal iodide flows out of the tube 12, it reacts with the ammonia that entered upstream at inlet 26 and traveled to the vicinity of the tube outlet 24 and the substrate 30, where the metal iodide and ammonia react, to form the metal nitride (MN) and deposit as a layer on the substrate 30, as indicated in FIG. 1.

An example of the reaction between iodine and metal, e.g., gallium, occurs as follows:

$$I_2 + 2Ga \rightarrow 2GaI \quad (1)$$

And the ensuing reaction with ammonia, $$GaI + 4NH_3 \rightarrow GaN + 4H_2 + N_2 + NH_4I \quad (2)$$

Also an iodide can be employed in place of iodine. For example, if hydrogen iodide were used instead of iodine, the initial reaction would occur as:

$$2HI + 2Ga \rightarrow 2GaI + H_2 \quad (3)$$

The reaction between the gallium iodide and ammonia would be the same as reaction (2).

Thus the present invention relates to a method for the production of M-nitride materials, where M is gallium (GaN), Aluminum (AlN), indium (InN), and ternary and quaternary combinations of the above such as GaAlN.

Accordingly, the invention provides a process in which elemental iodine or an iodide is caused to flow over a desired molten metal, such as gallium. The iodine or hydrogen iodide reacts with the metal to form the metal iodide. The metal iodide is volatile at elevated temperatures and flows downstream to react with ammonia to form the metal nitride. The metal nitride can deposit on a substrate to form a nitride film, either thin or thick, it can deposit on a nitride seed single crystal to grow larger single crystals, or it can self-nucleate on the walls of the growth chamber to form high purity metal nitride material. Large single crystals grown by this method can be used as substrates for making nitride electronic devices.

Thus the IVPG reactor of the invention includes two quartz tubes, one tube within the other, placed in a three-zone furnace per FIG. 1.

The thermal profile of the furnace is designed to exploit the supersaturating conditions necessary for good nucleation and yet to maximize the growth rate. Two boats, one containing iodine and the other containing gallium, are placed inside the smaller quartz tube under forming gas or hydrogen. The carrier gas flow is high enough to prevent any reaction by diffusion or convection between the gallium source and ammonia flowing through the larger tube (FIG. 1). The inside diameters of the quartz tubes are, e.g., 21 and 50 mm, respectively. A flexible jacket heater is used to heat the iodine. Four thermocouples are used for indication and precise control of the temperature.

Two series of experiments were conducted. The approach was to change only one parameter at a time as far as possible for the successful carrying out of the process. The changeable parameter in the first series was the pressure (from 750 to 75 Torr). For the second series, the pressure was maintained at a favorable level (200 Torr), while the V-III ratio was changed. The iodine, gallium, and substrate temperatures for the first series of experiments were 38–50° C., 910C and 1020° C., respectively (see Table 1) and for the second series, 45° C., 975° C. and 1015–1025° C., respectively (see Table 2). The thermocouple positions, starting from the iodine boat were 0, 56, 76, and 96 cm.

Three different flow regimes were distinguished: a mixing zone, where GaI is injected into the ammonia stream, a laminar zone, where the substrate is placed for growth, and a recirculation zone, where condensation of $NH_4I$ occurs.

C-plane sapphire wafers with pre-deposited 1 µm MOCVD films were used as substrates.

The experiments shown in Table 1 were carried out using unpurified forming gas as the carrier gas. Later experiments shown in Table 2 were conducted using pure hydrogen as the carrier gas, an improvement made in order to reduce the oxygen contamination.

of the inner tube into the growth zone. The GaN layers grown at growth rates up to 10–11 µm/h (Table. 1) had smooth transparent surfaces and thickness up to 32 µm, measured by scanning electron microscope JSM-840.

Table 1. Pressure dependence of some parameters at constant gallium source and substrate temperatures ($T_{Ga}$=910° C. and $T_{sbstrate}$=1020° C.). Unpurified forming gas was used as a carrier gas.

| run # | pressure [Torr] | growth rate [µm/h] | layer thickness [µm] | flow rate $NH_3$-GaI [sccm] | pressure $NH_3$-I [Torr] | V/III Ratio | RC 002 102 [arcsec] | PL FWHM [meV] | time [h] | iodine temp. [° C.] |
|---|---|---|---|---|---|---|---|---|---|---|
| 44 | 750 | 3.08 | 18.5 | 125–1.95 | 338–9.76 | 64.10 | 887–1108 | 116 | 6 | 50 |
| 45 | 750 | 3.67 | 22 | 125–2.00 | 338–10.0 | 62.50 | 680–1265 | 131 | 6 | 51 |
| 47 | 600 | 3.80 | 19 | 125–2.44 | 270–9.76 | 51.23 | 510–1083 | 135 | 5 | 50 |
| 48 | 500 | 5.33 | 16 | 125–2.93 | 225–9.76 | 42.66 | 672–1028 | 125 | 3 | 50 |
| 49 | 400 | 6.17 | 18.5 | 125–3.13 | 180–8.16 | 39.87 | 614–949 | 123 | 3 | 45.5 |
| 50 | 300 | 8.23 | 25.5 | 125–3.87 | 135–7.74 | 32.30 | 767–1286 | 120 | 3.1 | 42.5 |
| 51 | 200 | 10.67 | 32 | 125–5.65 | 90–7.54 | 22.12 | 880–1440 | 120 | 3 | 42 |
| 52 | 100 | 10.5 | 31.5 | 125–9.75 | 45–6.50 | 12.82 | 457–691 | 117 | 3 | 38 |
| 53 | 75 | 0 | — | 125–13.4 | 34–6.72 | 9.30 | — | — | 3 | 38.5 |
| 54 | 75 | 0 | — | 125–13.3 | 34–6.63 | 9.43 | — | — | 3 | 38.3 |

The reaction between GaI and $NH_3$ is controlled by the ratio between the flow rate of the carrier gas and ammonia. Typical flow rates are about 150 sccm forming gas and 125 sccm $NH_3$ for the first series of experiments. 200 sccm hydrogen and $NH_3$ flow in the range 125–175 sccm were used in the second series. All of those flow rate values are considerably less than the normal HVPE flow rates.

By controlling the iodine source temperature with a separate heater, the partial pressure of gallium iodide, $P_{GaI}$, can be adjusted from run to run. The iodine source temperature was controlled during each experiment to provide a constant vapor composition in the carrier gas. The temperature was held below 113° C., where the source (of $I_2$) remains as a solid.

More than 50 experiments were conducted at pressures from 750 to 75 Torr (the first series) and V-III ratios between 9 and 64 (the first and the second series) in order to establish the most suitable growth conditions. The substrate and the gallium temperatures were different for the two series, but held constant within each series. The ratio between the flow rates of ammonia and the carrier gas was changed only during the second series (Table 2). When the total system pressure was changed, the iodine temperature was adjusted to compensate for the increased fugacity of $I_2$ at lower pressures. After each experiment the weight losses of gallium and iodine were precisely measured. The weight of the consumed $\Delta$Ga and $\Delta$I were found and their molar ratio, $\Delta$Ga/$\Delta$I was calculated. (For the iodine source, it was necessary to lower the temperature to compensate for the lower ambient pressure, but the gallium boat temperature remained invariant.) The average value of $\Delta$Ga/$\Delta I_{ave}$ is close to 1, indicating that the most probable product in the reaction between Ga and I is GaI with some excess $I_2$ as it passes out Table 2. Growth parameters at constant pressure (200 Torr.) constant iodine, gallium and substrate temperatures ($T_I$=45° C., $T_{Ga}$=975° C.). Hydrogen was used as a carrier gas (with in-line Aeronex purifier for run #69).

| run # | Growth rate [µm/h] | substrate temperature [° C.] | layer thickness [µm] | V/III ratio | RC 002 102 [arcsec] | PL emission |
|---|---|---|---|---|---|---|
| 62 | 3.4 | 1015 | 12 | 32 | 300 438 | light yellow |
| 63 | 2.7 | 1015 | 9.5 | 27.5 | 248 312 | no yellow |
| 69 | 6.5 | 1025 | 19.5 | 32 | 263 407 | no yellow |

Figure 2:
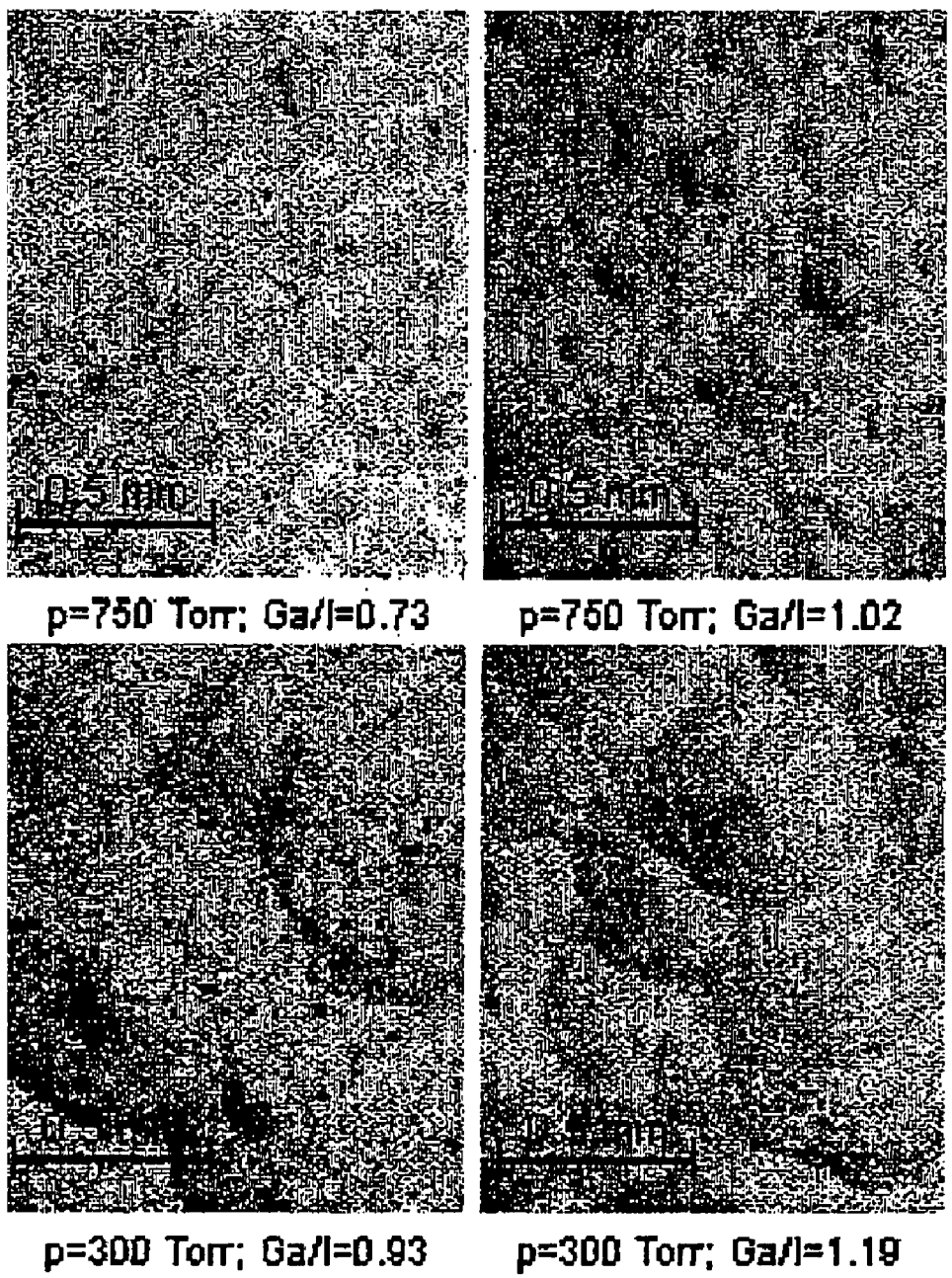
FIG. 2 has plan views of metal nitride samples, grown at different conditions under the same magnification.

The micrographs shown in FIG. 2 illustrate the surface quality of each sample using a Nomarski optical microscope under 50× magnification. The diameters of the surface "hexagons" were roughly in the range of 0.05–1 mm, with larger size observed at lower pressures, which is reasonable from a kinetic point of view, and observed by other investigators. Also, a number of dark spots can be seen on the layer surfaces (FIG. 2: the two photos at the left) when the molar ratio between gallium and iodine, $\Delta$Ga/$\Delta$I, was less than 1 and/or when the V-III ratio was smaller. However, the dark spots are almost absent when that ratio was close to 1 and/or when the V-III ratio was larger (FIG. 2: the two photos at the right). These spots can be considered as condensed gallium droplets which are due to: 1) gallium iodide transfer at lower temperature, or: 2) prevalence of the III-element over the V-element. A similar effect is reported by other investigators who, in attempting to prevent gallium condensation, maintain a richer nitrogen flow during a MBE growth. Chemical analysis of the grown layers by glow discharge mass spectroscopy (GDMS) showed small traces of iodine at ppb levels.

The data from Table 1 can be analyzed by examining the trends among different growth parameters (pressure, gas velocity, etc.) and plotting their relationships. An initial observation is the inverse relationship between growth rate and pressure (for P>100 Torr—see columns 2 and 3 of Table 1). Similarly, the trend of higher growth rate corresponds to gas velocity, which increases with reduced pressure, when mass flow rates are held constant, as in these experiments.

At 1020° C. with these gas flow conditions 100 Torr is the lower limit for growth. Below this pressure, the supersaturation becomes negative, i.e., the evaporation rate exceeds the deposition rate. A subsequent experiment proved that GaN can be grown at an ambient pressure as low as 5 Torr with the same flow rates as in Table 1, provided the growth temperature is lowered to 875° C. Using this approach, one can bracket the thermodynamic range of gallium nitride decomposition and growth.

The influence of the substrate temperature and V-III ratio is shown in Table 2, where a higher growth rate is obtained at higher substrate temperature. The growth rate is theoretically predicted to reach a maximum at certain temperatures and V-III ratio. Furthermore, the temperature must be high enough that GaN will not deposit on the reactor walls, since it is known that the simultaneous presence of liquid gallium and GaN acts as a catalyst to ammonia decomposition. Thus, the higher growth temperature brings the system closer to equilibrium and increases the reactivity of ammonia at the wafer surface. Both of these factors contribute to a higher growth rate.

Figure 3:
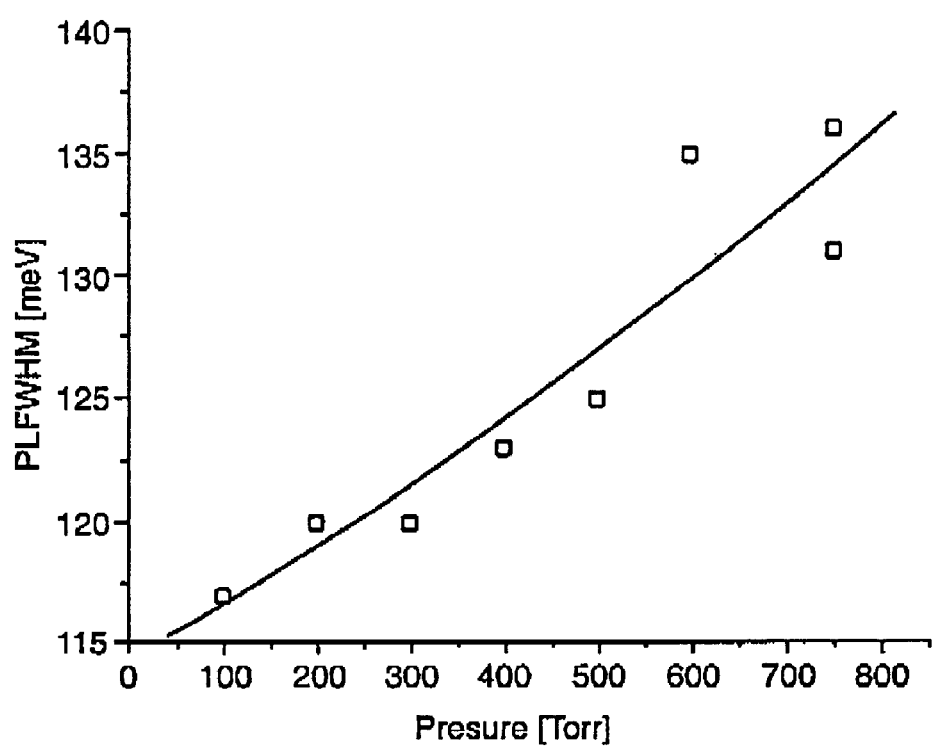
FIG. 3 is a graph showing room temperature PLFWHM as a function of the ambient pressture.
Figure 4:
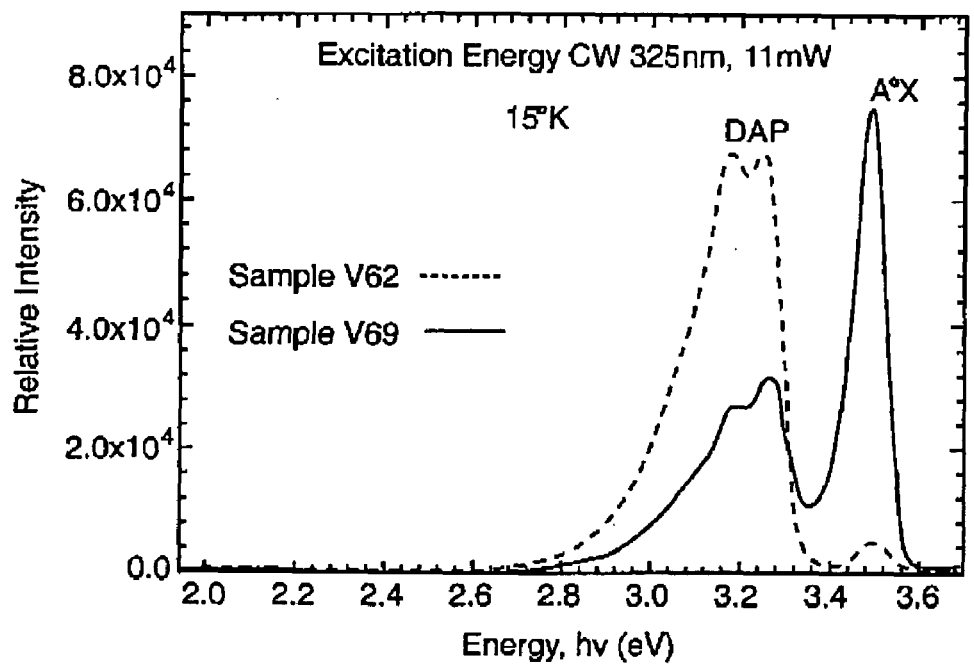
FIG. 4 is a graph of low temperature PL spectra of GaN layers grown by IVPG, with $H_2$ carrier gas.
Figure 5:
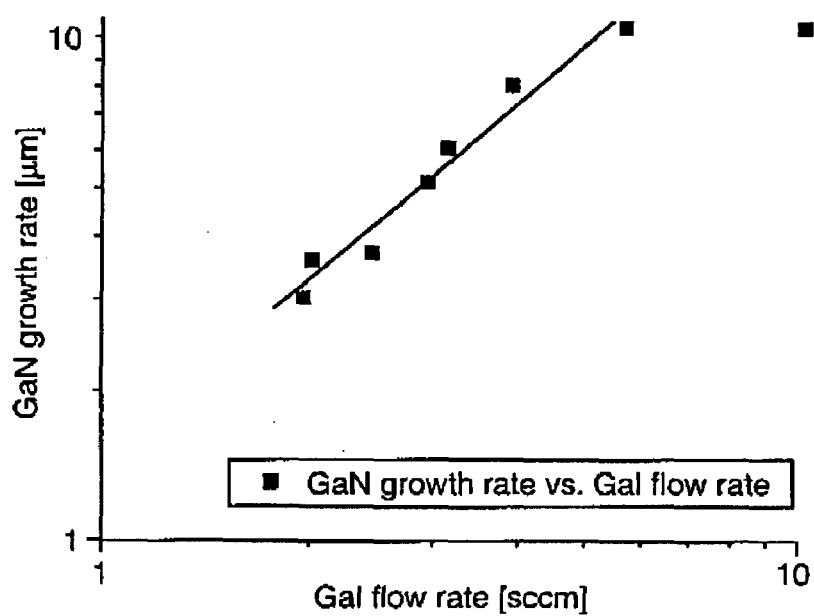
FIG. 5 is a graph showing the growth rate of GaN as a function of the GaI flow rate.

Bandgap PL peaks were measured at room temperature to compare the optical quality of GaN films grown at different pressures. A repetitively pulsed OPO system with a wavelength of 247 nanometers was used as an excitation source. Values for full width at half maximum (FWHM) of the room temperature PL signals are in a narrow range (117–116 meV) for the whole first series (Table 1) of pressure experiments. Moreover, an almost linear tendency for decreasing of the FWHM values with pressure decrease is observed (FIG. 3). This is an additional confirmation that the IVPG process at lower pressure is not only faster, but can give layers of higher crystal quality as well. In the second series of experiments, using $H_2$ carrier gas, the crystal quality was further improved as demonstrated by the significantly narrower rocking curve widths and the absence of a yellow emission band in PL at 15K. The excitation source used for the measurements in Table 2 was a continuous wave 325 nm He—Cd laser. FIG. 4 shows the PL spectrum from two crystals cooled to 15K, illustrating the low level of yellow luminescence, as well as the donor-acceptor pair (DAP) defect reduction resulting from higher purity process gases. Such a low level of yellow luminescence is unusual as compared to many reports of epitaxial GaN grown on sapphire. The reduction of the DAP defect indicates the beneficial effect of reduced contamination in the process gases.

Other investigators have observed yellow luminescence (YL) in GaN epitaxial films, although the precise origin of the defect is still unclear. The absence of any yellow peak in the second series of experiments is evidence for the significant improvement of the growth system. Also, it shows that the defects, which are responsible for the yellow band have been eliminated.

The influence of the distance between nozzle and substrate was a major factor in crystal quality especially at low pressures because of the rapid gas velocity. Moreover, the "nozzle-substrate" distance within the reactor required adjustment at every change of ambient pressure. The velocities of the two gases must be adjusted to balance each other and to prevent back-streaming, in consideration of the different diameters of the 2 tubes.

If the nozzle and the substrate are too close, the wafer is in the mixing zone, where rapid 3-dimentional growth occurs with a large number of crystallites. Conversely, if the substrate is too far away, growth is very slow because of competing processes (like ammonia decomposition) in the recirculation zone. The correct position, where laminar flow occurs over the substrate, must be found by trial and error.

Thus, high quality MN epitaxial films have been grown on a substrate, e.g., sapphire using IVPG. The growth mechanism, per the invention, is seen to be significantly improved when conducted at reduced pressures and also is affected by the gas flow rate and V-III ratio on the crystalline quality of MN product, e.g., GaN epilayers.

A prior art problem occurring in systems where $NH_3$ flow is used, is uniformity of gas flow as noted above. The high stability of the ammonium molecule requires high ammonia flow. However, as shown above, an improvement of flow uniformity is achieved by reducing the ambient pressure inside the vapor phase reactor below a pressure of 1 atm. The present invention demonstrates the improvement in gas flow uniformity and of the deposited MN product when reduced pressure is applied inside the vapor phase reactor during the IVPG process. That is, a more uniform gas flow means a more uniform growth of the metal nitride film or crystals.

As noted above, growth conditions were investigated per the invention in the range of pressure between 1 and 0.1 atmosphere, while maintaining the same temperature gradient and mass flow rates for the reactant gases. Within these parameters, it was found that the fastest growth rate for GaN layers is obtained at vapor pressures close to equilibrium. The data indicates crystal quality is also optimized under these conditions.

The III-Nitrides are wide band gap semiconductors with direct band gap energies in the range of 1.9–6.2 eV. They possess high chemical inertness because of the significant bond energy between the atoms, and excellent thermal, optical and electrical properties. With such properties as high thermal conductivity, large index of refraction, high electron velocity and carrier mobility, and high breakdown field (2.8 MV/cm for GaN), these materials are very competitive in a wide range of applications. A number of devices, like red, blue, green and white emitters and full color displays, visible-blind and solar-blind photo-detectors, high power microwave sources, high power switches, wireless communications, high temperature electronics, non volatile memories, pyro- and piezo-detectors, have major military and commercial potential.

For further discussion on the above method and the resulting MN products, see a Paper entitled "New Iodide Method for Growth of GaN" by Michael Suscavage et al., published in "Physica Status Solidi, on 22 Nov. 2001, in Vol 188, p 477, which Paper is incorporated herein by reference.

Per the invention the temperature of the iodine boat in the reactor can range from 38–50° C. The temperature of the metal boat can range from 500–1000° C. and preferably from 900–975° C. and the temperature in the substrate zone can range from 500–1300° C. and preferably from 1000–1125° C. The flow rates of I2 or HI can range, in the small tube or container, from 4–50 sccm and in the large external tube or container, from 100–300 sccm for the ammonia flow rate, at reduced pressure, so as to obtain a growth rate of MN of 5–40 μm/hr. and a resulting film thickness of 5–500 μm.

As noted above the pressure in the reactor, e.g., in FIG. 1 for MN formation, can range from 750 Torr down to 100 Torr, at temperatures no lower than 1020° C. However, with reduction of the temperature of gas flow in the inventive reactor, such pressure can be reduced from 100 Torr down to 75 Torr down to 5 Torr and even as low as 3 Torr, with the same flow rates as in Table 1, provided that the growth temperature is lowered to at least 875° C. Thus per the invention, it can be said that the pressure in the reactor can range from 750–3 Torr, with adjustments in temperature, e.g., in the substrate zone, from 1125° C. in suitable gradients down to 875° C. or below, as can be determined by those skilled in the art.

At reduced pressure, the flow rate of the respective vapors and gasses increase so one can obtain a coating on a substrate of more uniform thickness of deposition because the diffusion coefficient of MI or MN is larger at reduced pressures and increased flow rates in the substrate zone. Also gas flow rates increase with the reduced pressure, which means a higher deposition or growth rate on the substrate along with the improved uniformity of deposition.

As noted above, substrates of choice for the growth of the metal nitrides are sapphire or silicon carbide but other substrates can be employed within the scope of the invention.

What is claimed is:

1. A reactor for forming a metal nitride (MN) comprising,
   a) a first container,
   b) said container having an upstream inlet, followed by a first boat for iodine ($I_2$), a second boat for M spaced downstream from said first boat and an outlet located downstream from said second boat,
   c) means to reduce the pressure in said container to below 760 Torr,
   d) means for heating the two boats,
   e) means for flowing iodine vapor from said first boat or for flowing hydrogen iodide (HI) from said inlet downstream to said second boat to contact said M to form metal iodide (MI) vapor and for flowing said MI vapor out said outlet,
   f) means to contact the outlet MI vapor with ammonia to form said MN
   g) means to vary the heat applied to the first boat to vary the vapor pressure of $I_2$ and
   h) means to vary the heat applied to the second boat to vary the formation rate of MI, to control the quality and/or quantity of the deposited MN.

2. The reactor of claim 1 having a substrate positioned proximate said outlet and means to deposit said MN vapor on said substrate as a film or layer.

3. The reactor of claim 1 wherein the outlet of said first container extends into a proximate second container which holds ammonia and means for flowing said MI vapor into said second container to form MN vapor and to deposit said MN vapor on a substrate or on one or more seeds or to self-nucleate on the walls of said second container, and vacuum pump means being applied to said second container, downstream of the depositing MN vapor.

4. The reactor of claim 1 wherein a substrate is mounted in said second container proximate said outlet for deposit of said MN thereon.

5. The reactor of claim 1 wherein said first and second containers are elongated.

* * * * *